(12) United States Patent
Basceri et al.

(10) Patent No.: US 6,720,607 B1
(45) Date of Patent: *Apr. 13, 2004

(54) METHOD FOR IMPROVING THE RESISTANCE DEGRADATION OF THIN FILM CAPACITORS

(75) Inventors: Cem Basceri, Boise, ID (US); Husam N. Al-Shareef, Al-Ain (AE)

(73) Assignee: Micron Technology, Inc., Boise, ID (US)

( * ) Notice: Subject to any disclaimer, the term of this patent is extended or adjusted under 35 U.S.C. 154(b) by 203 days.

This patent is subject to a terminal disclaimer.

(21) Appl. No.: 09/705,700

(22) Filed: Nov. 6, 2000

Related U.S. Application Data

(62) Division of application No. 09/259,259, filed on Mar. 1, 1999, now Pat. No. 6,258,655.

(51) Int. Cl.[7] .............................................. H01L 27/108
(52) U.S. Cl. ................... 257/306; 257/307; 257/308; 257/300; 257/301; 257/302; 257/303
(58) Field of Search .................... 257/296–315

(56) References Cited

U.S. PATENT DOCUMENTS

| | | | |
|---|---|---|---|
| 5,354,698 A | 10/1994 | Cathey, Jr. | |
| 5,516,363 A | 5/1996 | Azuma et al. | |
| 5,566,046 A | 10/1996 | Kulwicki | |
| 5,614,018 A | 3/1997 | Azuma et al. | |
| 5,620,739 A | 4/1997 | Azuma et al. | |
| 5,677,825 A | 10/1997 | Evans, Jr. et al. | |
| 5,731,220 A | 3/1998 | Tsu et al. | |
| 5,817,532 A | 10/1998 | Joo et al. | |
| 6,143,063 A | * 11/2000 | Hayashi et al. | |
| 6,258,655 B1 | * 7/2001 | Basceri et al. | |

OTHER PUBLICATIONS

Banlecki et al.; "Electrical and Microwave Properties on Mn Implanted (Ba,Sr) $TiO_3$ Thin Films"; Mat. Res. Soc. Symp. Proc. vol. 493, 1998, pp. 27–32.
Patent Abstract of Japan, vol. 1996, May 31, 1966; JP 08 017764 (ULVAC Japan Ltd), Jan. 19, 1996.
Patent Abstract of Japan, vol. 014, No. 461 (E–0987), Oct. 1990; JP 02 186614 A (Seiko Epson Corp), Jul. 20, 1990.

* cited by examiner

*Primary Examiner*—Fetsum Abraham
(74) *Attorney, Agent, or Firm*—Dickstein Shapiro Morin & Oshinsky LLP

(57) ABSTRACT

A method for ion implantation of high dielectric constant materials with dopants to reduce film leakage and improve resistance degradation is disclosed. Particularly, the invention relates to ion implantation of $(Ba,Sr)TiO_3$ (BST) with donor dopants to reduce film leakage and improve resistance degradation of the BST film. The invention also relates to varying the ion implantation angle of the dopant to uniformly dope the high dielectric constant materials when they have been fabricated over a stepped structure. The invention also relates to integrated circuits having a doped thin film high dielectric material used as an insulating layer in a capacitor structure.

25 Claims, 2 Drawing Sheets

METHOD FOR IMPROVING THE RESISTANCE DEGRADATION OF THIN FILM CAPACITORS

This application is a divisional of Ser. No. 09/259,259, filed Mar. 1, 1999, U.S. Pat. No. 6,258,655 the subject matter of which is incorporated by reference herein.

FIELD OF THE INVENTION

The invention relates generally to ion implantation of high dielectric constant materials with dopants to reduce film leakage and improve resistance degradation. Particularly, the invention relates to ion implantation of $(Ba,Sr)TiO_3$ (BST) with donor dopants to reduce film leakage and improve resistance degradation of the BST film. The invention also relates to integrated circuits having a doped thin film high dielectric material, used, for example, as an insulating layer in a capacitor.

BACKGROUND OF THE INVENTION

High dielectric constant (HDC) materials have many microelectronic applications, such as DRAMs, embedded DRAMs, SRAMs, FeRAMS, on-chip capacitors and high frequency capacitors. Typically, these applications employ HDC materials in a capacitive structure, although the present invention may be used to make an HDC thin film with improved properties which is not part of a capacitor.

To facilitate construction of larger DRAMs with correspondingly smaller memory cells, capacitor structures and materials which can store the necessary charge in smaller spaces are needed. One of the most promising avenues of research to achieve this goal is the area of HDC materials. HDC materials generally have dielectric constants greater than 50. Examples of particular HDC materials are metal oxide materials such as, lead zirconate titanate (PZT), barium titanate, strontium titanate ($SrTiO_3$), and barium strontium titanate (BST). It is desirable that such a material, if used for DRAMs and other microelectronics applications, be formable over an electrode and underlying structure (without significant harm to either), have low leakage current characteristics and long lifetime, and, for most applications, possess a high dielectric constant. The present invention relates to a method of forming a doped HDC film, specifically a barium and/or strontium titanate dielectric with improved resistance degradation and reduced film leakage.

While BST materials have been manufactured in bulk form previously, the physical and electrical properties of the material is not well understood when BST is formed as a thin film (generally less than 5 um) on a semiconducting device. While the dielectric constant of undoped bulk BST is maximized for median grain sizes of between about 0.7 um and about 1.0 um, for smaller grain sizes the dielectric constant fails off rapidly. Thus, BST having extremely small grain size is usually undesirable. Unfortunately, in submicron microcircuits such as DRAM capacitors, particular constraints are placed on BST grain size in the thin film. First, the annealing temperature for BST thin films must generally be kept far below the temperatures commonly used for sintering bulk BST ceramics (generally less than 700° C. vs. typically greater than 1100° C. for bulk BST) to avoid damage to the underlying device structure. Thus, the grain nucleation and growth kinetics of the BST crystal lattice is inhibited resulting in smaller grain sizes. Second, the desired film thickness in microelectronic applications may be much less than 5 um (preferably between about 0.05 um and about 0.1 um). It has been found that median grains sizes generally less than half the BST film thickness are required to control dielectric uniformity and avoid shorted capacitors. Thus, a method for producing a HDC material in a thin film structure having good dielectric properties is needed.

Generally, the introduction of dopant materials has been shown to affect the dielectric properties of the HDC thin film materials. Doped metal oxide materials, such as BST, in a MOCVD or sol-gel doping process are known to be useful in the manufacture of integrated circuit thin film capacitors having high dielectric constants. See for example, U.S. Pat. No. 5,122,923, herein incorporated by reference. However, while the effects of some dopants is known, dopant chemistry is far from an exact science.

It is known to be much harder to accurately control and predict the electrical properties of doped metal oxides as compared with traditional doped materials. Further, the usual methods of making oxides, such as BST, i.e. sputtering and pressing of powders, are inherently difficult to exactly control. In both formation processes, the dopants tend to be more highly concentrated in some parts of the film than in other areas of the film.

Prior methods used to dope the $(Ba,Sr) TiO_3$ material utilized appropriate precursors of the possible dopants in a metal organic chemical vapor deposition (MOCVD) process. Typical MOCVD deposition of BST utilizes the precursors of Ba(bis(2,2,2,6-tetramethyl-3,5-heptanedionate))$_2$-tetraethylene glycol dimethyl ether; Sr(bis(2,2,2,6-tetramethyl-3,5-heptanedionate))$_2$-tetraethylene glycol dimethyl ether and Ti(bis(isopropoxy))$_2$bis(2,2,2,6-tetramethyl-3,5-heptanedionate)$_2$. A liquid delivery system mixed, metered and transported the precursors at room temperature and high pressure to a heated zone, where the precursors were then flash vaporized and mixed with a carrier gas, typically argon, to produce a controlled temperature, low pressure vapor stream. The gas stream was then flowed into a reactor mixing manifold where the gas stream mixed with oxidizer gases. Typically the oxidizer gases were $O_2$ & $N_2O$. The mixture of the gas stream and the oxidizer gases then passed through a shower head injector into a deposition chamber. In the MOCVD deposition, both the ratio of the concentrations of the metalorganic compounds in the vaporized liquid and the deposition conditions determine the final film stoichiometry.

As can be realized, three component MOCVD process (for BST thin films) is quite complicated. Adding one or more additional components to the process (such as Nb, Ta or Sb dopants) will generate more complexity in the process chemistry. Additionally, developing the precursor chemistry of the multicomponent system to dope BST is also an important requirement.

A second prior method for doping BST is using a sol-gel process. Studies on a BST sol-gel process have been undertaken. These studies seem to show that doping of BST or other perovskite titanates via sol-gel process is possible. However, for DRAM technology, sol-gel technology for doping BST films is not a viable deposition process since step coverage with 10 to 1 aspect ratios can not be achieved with the sol-gel processes. Thus, when doping BST in a sol-gel process it is difficult to accurately dope the BST film along the sidewalls of a deep trench capacitor or a tall stud capacitor.

Therefore, in the MOCVD and sol-gel processes, doping BST with higher valence cations, such as, for example, Nb, Ta La or Sb, is challenging. Having stable precursors of such elements, adequate incorporation efficiency, uniformity in deposited films and control of stoichiometry in BST with process conditions still need to be explored. The present invention overcomes the difficulties of MOCVD and sol-gel doping of BST thin film dielectrics by using an ion implantation method to dope the BST thin film.

SUMMARY OF THE INVENTION

The present invention overcomes the drawbacks of the conventional methods and provides an ion implanted high dielectric constant material having reduced film leakage and improved resistance degradation. Particularly, the present invention provides a method for ion implantation of BST thin film dielectric material having reduced film leakage and improved resistance degradation.

Further, the inventors have observed that stoichiometry of BST formed on the sidewalls of trenches can deviate from the target values. This becomes a serious issue for deep trenches (e.g., 10:1 aspect ratios) since properties such as dielectric constant, leakage, relaxation and resistance degradation will deviate at the sidewalls from other locations on a semiconductor. With the present invention sidewalls can be doped to achieve the desired stoichiometries by using appropriate implant angles. Thus, with appropriate doping levels, sidewall stoichiometries can be tailored to achieve desired physical properties.

The above and other advantages and features of the invention will be more clearly understood from the following detailed description which is provided in connection with the accompanying drawings.

DETAILED DESCRIPTION OF THE PREFERRED EMBODIMENTS

Figure 1:
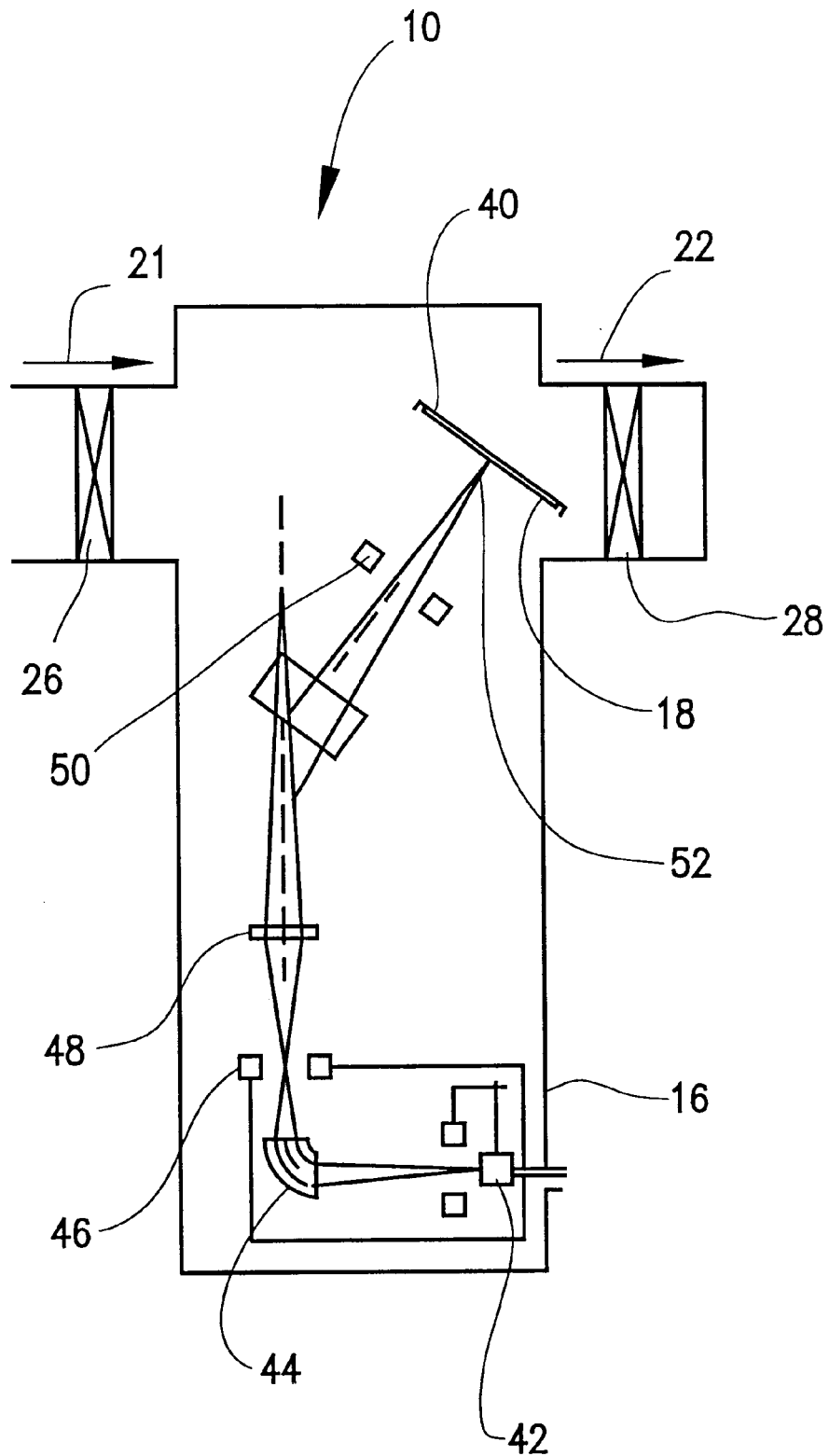
FIG. 1 is a schematic view of one embodiment of an apparatus used in the present invention.

The terms wafer or substrate used in the description include any semiconductor-based structure having an exposed silicon surface in which to form the contact electrode structure of this invention. Wafer and substrate are to be understood as including silicon-on insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation. It should also be understood that the term wafer or substrate may relate to a base semiconductor structure having undergone processing steps to arrive at a semiconductor platform which may undergo further processing.

The term "metal oxide" or "high dielectric constant material (HDC)" used herein means a material of the general form $ABO_3$ where A and B are cations. The term is intended to include materials were A and B represent multiple elements; for example, it includes materials of the form $A'A''BO_3$, $AB'B''O_3$, and $A'A''B'B''O_3$, where A', A", B' and B" are different metal elements. Preferably, A, A", A', are metals selected from the group of metals consisting of Ba, Bi, Sr, Pb, Ca, and La, and B, B', and B" are metals selected from the group consisting of Ti, Zr, Ta, Mo, W, and Nb. Preferably the metal oxide is a perovskite. Many of these metal oxides are ferroelectrics; however the present invention is not so limited.

The metal oxides or high dielectric constant materials according to the present invention are doped by ion implantation of dopants into the host lattice of the metal oxide or HDC material. Ion implantation is a well known process for the implantation of dopant elements into a material. The dopants are selected from those known in the art. The dopants should be selected to optimize the desired physical characteristics of the HDC thin film, such as reduced film leakage, improved resistance degradation improved fatigue lifetime, imprint prevention and the like. The dopant also should be selected based on the lattice of the particular HDC material. Preferably the doping materials are those such as niobium, tantalum, antimony at the B-site and lanthanum at the A-site.

As will be understood by those skilled in the art, most crystalline materials having an $ABO_3$ formula are perovskite crystalline compounds. These structures ideally have a unit cell forming a simple cubic structure including A-type cations at the corners of a cube, a B-type cation at the centroid of the cube, and oxygen atoms entered at each facial plane of the cube; however, this idealized structure may vary considerably with temperature. Other forms of perovskite-type compounds can be classified, for example, as orthombic, pseudocubic, pseudotetragonal, rombohedral, and tetragonal.

Materials such as barium strontium titanate (BST) exhibit electrical properties that are often very different when measured from bulk ceramics, as compared to the thin film materials (i.e., those less than about ten microns thick) that are used in integrated circuits. Bulk ceramics are typically sintered at temperatures reaching from 1400° C. to 1500° C., and this high temperature tends to produce a correspondingly high degree of defect-free crystallization. On the other hand, thin films are generally not sintered above about 900° C. to 1100° C. due to the potential for breakdown of integrated circuit wiring, layer interdiffusion, and cracking. Thin films are most often deposited by conventional sputtering techniques, e.g., radio frequency or DC magnetron sputtering. On a microscopic level, these techniques can provide clumped areas of massed materials having nonuniform thicknesses, stratified layers that are improperly mixed to non-homogeneic proportions that are incapable of forming proper average crystals according to the mixture of ingredients. Accordingly, those attempting to replicate bulk ceramic behavior in thin film electronic components have often been unable to duplicate these parameters, even if the electron transfer mechanism remains the same between the two thicknesses of materials.

The Ba/Sr ratio of BST should be about 70/30 allowing the material to operate in the paraelectric region for DRAM applications since this will reduce the complexity of understanding the material's response. Therefore, the importance of Ba/Sr ratio in the BST material is controlling the curie temperature (Tc) to be nearly room temperature, thus giving the material the advantage of having a high dielectric constant since the dielectric constant exhibits a peak near Tc while allowing the material to be in the paraelectric region for the operating temperature of the DRAM cell. By maintaining a Ba/Sr ration of about 70/30, the danger of shifting to ferroelectric state by a possible shift in temperature (less than room temperature) is eliminated. This is because the material exhibits a curie-point at room temperature for Ba/Sr: 70/30, but does not go to the ferroelectric phase until temperatures of about 190° K.

Capacitor size requirements presently constitute a limiting factor in further reductions of DRAM cell size. A reduction in DRAM cell size is essential to further significant increases in DRAM cell densities for use in an integrated circuit, but this size reduction advantage will require a further reduction in the size of the cell capacitor. Reduction of the capacitor size can be achieved by increasing the dielectric constant of the material used in the dielectric layer of the capacitor, in order to permit the use of a smaller surface area in a capacitor having the desired dielectric properties. Prior methods for increasing the dielectric constant of materials have met with failure because these methods also increased the leakage current and the corresponding conductive current density of the dielectric material at fixed bias voltages. Excessive leakage current or conductive current density renders the material unfit for capacitors in integrated circuits and, in particular, unfit for capacitors in DRAM cebs. It remains a problem in the field to increase the dielectric constant of materials, even for high dielectric constant material, such as BST, without significantly increasing the leakage current.

The current benchmark for advanced DRAMs is a 10 year lifetime at 85° C. and 1.1 V. Under these projected operating conditions, the most important failure mechanism in perovskite titanate thin films is resistance degradation. Resistance degradation is defined as a slow increase of the leakage currents under a constant applied electric field (AC or DC field) after prolonged times. As temperature and applied voltage increase, degradation lifetime decreases.

The theories for resistance degradation are based on electromigration of oxygen vacancies under an applied electric field. Oxygen vacancies ($Vo^{..}$) are present in significant concentrations in undoped and acceptor-doped alkaline-earth titanates. They are positively charged with respect to host lattice and they can migrate toward the cathode under an electric field. While oxygen vacancies pile-up in front of the cathode and are compensated by the electrons injected from the cathode, a chemical reduction, as exemplified below, can occur at the anode producing additional $Vo^{..}$:

$$O_o^x \rightarrow 1/2 O_2 + Vo^{..} + 2e^-$$

This reaction causes the formation of a p-n junction biased in the forward direction and leads to an increase of leakage currents. In insulating perovskite titanates, it has been observed that acceptors are compensated by oxygen vacancies, while donors are compensated by cation vacancies. It has also been observed that resistance degradation has been stabilized with donor doping.

While not wishing to be bound by theory, it is believed that resistance degradation can be improved by reducing oxygen vacancies in the thin film lattice. The resistance degradation mechanism for oxygen vacancy reduction will now be described with reference to a BST type material. It should be understood that similar reaction will take place to reduce oxygen vacancy for similar HDC materials. For BST material:

A-site ($Ba^{2+}$, $Sr^{2+}$) donor dopant: $La^{3+}$

B-site ($Ti^{4+}$) donor dopants: $Nb^{5+}$, $Ta^{5+}$, $Sb^{5+}$

These representative dopants for BST material are appropriate by considering their atomic sizes. Having these dopants in the lattice is expected to compensate positively charged oxygen vacancies. Charge equilibrium will be maintained by having these donors in the lattice, as opposed to oxygen vacancy formation.

The defect reaction takes place as (e.g., for $Nb^{5+}$ doping on B-site):

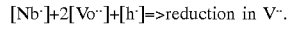

e.g., for $Nb^{5+}$ doped $BaTiO_3$:

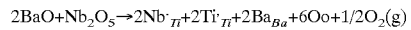

equivalent to: $[Nb^.]+2[Vo^{..}]+[h^.]$ or $\rightarrow Nb_2O_5 + Vo^{..} \rightarrow 2Nb^._{Ti} + 5O_o$ Thus, the addition of the donor dopants to the B-site of the BST host lattice reduces the oxygen vacancies, thereby inhibiting the formation of a p-n junction and reducing the resistance degradation of the film.

An exemplary apparatus used in the process for ion implantation according to one embodiment of the present invention is described below. It is to be understood, however, that this apparatus is only one example of many possible different arrangements that may be used to implant dopants according to the invention. The invention is not intended to be limited by the particular apparatus described below.

Referring now to FIG. 1, a closed ion implant system 10 for ion implanting semiconductor wafers in accordance with the method of the invention is shown. The ion implant system 10 includes an ion implanter 16. The construction for the ion implanter 16 shown in FIG. 1 is merely illustrative as other types of ion implanter constructions would also be suitable. In the illustrative embodiment, the ion implanter 16 includes a wafer holder 40 for receiving a wafer 18 from the transport channel 26 and for holding the wafer for implantation. The wafer 18 has a high dielectric thin film layer formed thereon as discussed above. The ion implanter 16 includes an ion source 42, an analyzing magnet 44, an acceleration tube 46, a focus 48, and a gate plate 50. The ion implanter 16 is in flow communication with a suitable vacuum source (not shown) such as a turbo molecular pump. This generates a vacuum within the process chamber of the ion implanter 16. With this arrangement an ion implant beam 52 is focused on the high dielectric constant thin film on the surface of the wafer 18 for implanting a desired dopant (such as, for example, niobium, tantalum, antimony or lanthanum) into the crystal lattice structure of the high dielectric constant thin film. After ion implantation the wafer 18 is transferred from the wafer holder 40 to another transport channel 28. At the transport channel 28, the wafer 18 is discharged from the system 10.

Figure 2:
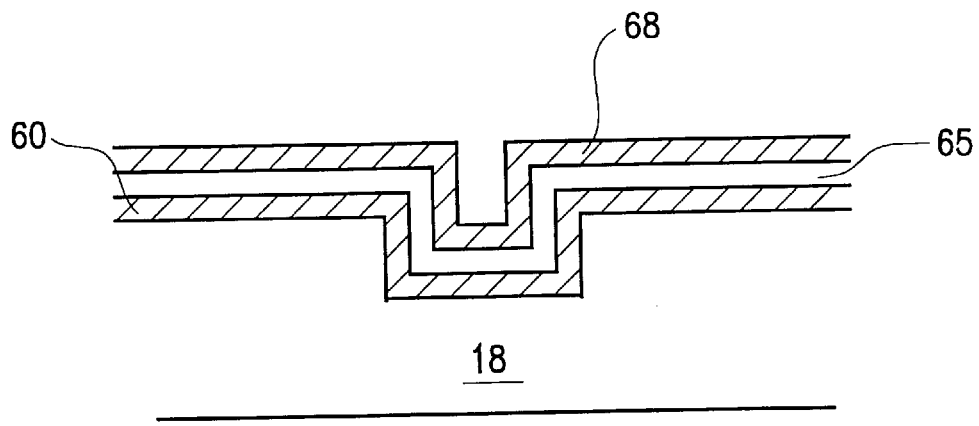
FIG. 2 is a cross sectional view of a container capacitor formed according to the present invention.

At this point, the wafer 18 has a conductive layer 60 formed of a suitable conductive material with a doped dielectric film layer 65 formed over the conductive layer 60. A second conductive layer 68 is then formed over doped dielectric film layer 65 to form the container capacitor structure as shown in FIG. 2. The conductive layers 60, 68 may be formed of any conductive material such as metals, i.e., Pt, Ru, Ir, Pd, Au or conductive oxides such as RuOx, IrOx. The doped dielectric film layer 65 is formed by doping a HDC material as described above.

Figure 3:
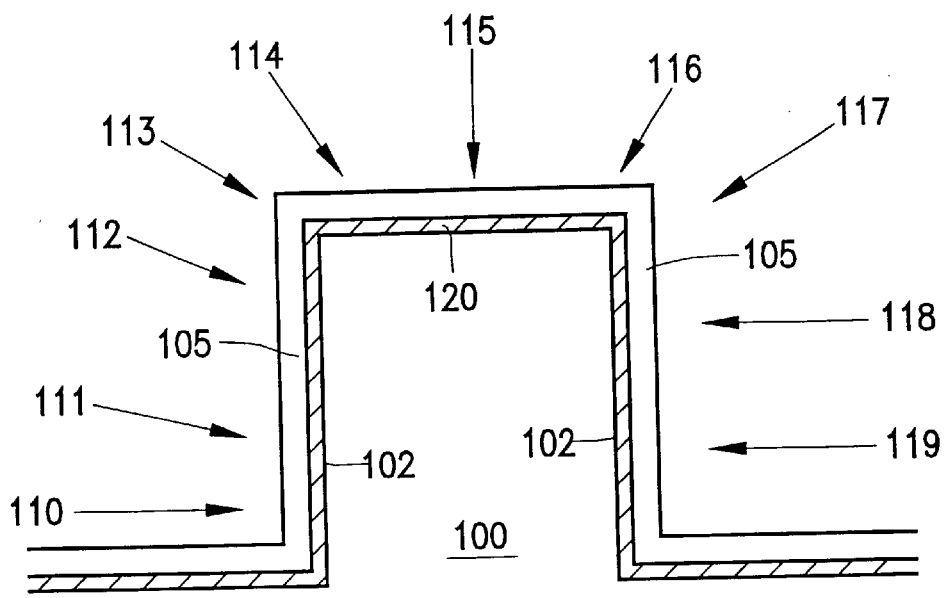
FIG. 3 is representative view of an ion implantation of the sidewalls of a semiconductor device having a stud formation.

Reference is now made to FIG. 3. This figure shows a representative view of a second embodiment of the present invention. Dopant levels of BST formed on the sidewalls 102 of a stud 100 can deviate from the target values. This becomes a serious issue for deep trenches (e.g., 10:1 aspect ratios) or studs as shown in FIG. 3 since properties such as dielectric constant, leakage, relaxation and resistance degradation will deviate at the sidewalls from the values for these properties in the horizontal portions of the device. According to the present invention the BST dielectric layer 105 formed over a conductive layer 120 on the sidewalls 102 can be doped to achieve the desired stoichiometries by appropriate implant angles 110–119 by appropriate movement of wafer holder 40. A second electrode (not shown) may then be formed over BST layer 105 to arrive a capacitor structure. Thus, with appropriate doping levels, the BST layer 105 overlying the conductive layer 120 on sidewalls 102 can be tailored to achieve desired physical properties.

The present invention provides a method for ion implantation of high dielectric constant materials with dopants to reduce film leakage and improve resistance degradation. The invention also provides a method for varying the ion implantation angle of the dopant to uniformly dope the high dielectric constant materials when they have been fabricated over a stepped structure.

It should again be noted that although the invention has been described with specific reference to DRAM memory circuits and container capacitors, the invention has broader applicability and may be used in any integrated circuit, such as, for example in a capacitor. Similarly, the process described above is but one method of many that could be used. Accordingly, the above description and accompanying drawings are only illustrative of preferred embodiments which can achieve the features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A BST high dielectric constant thin film material having improved resistance degradation formed by the steps of:
    providing a BST high dielectric constant thin film material;
    doping said BST high dielectric thin film material with a dopant by ion implantation.

2. The BST high dielectric constant thin film material according to claim 1, wherein said dopants are selected from the group consisting of niobium, lanthanum, antimony and tantalum.

3. The BST high dielectric constant thin film material according to claim 1, wherein said doping step includes doping the A-site of said BST high dielectric constant thin film material with a lanthanum$^{3+}$ ion.

4. The BST high dielectric constant thin film material according to claim 1, wherein said doping step includes doping the B-site of said BST high dielectric constant thin film material with a dopant selected from the group consisting of Nb$^{5+}$, Sb$^{5+}$ and Ta$^{5+}$.

5. The BST high dielectric constant thin film material according to claim 1, wherein said BST high dielectric constant film material is uniformly doped by varying the implant angle of said ion implantation.

6. The BST high dielectric constant thin film material according to claim 1, wherein said BST high dielectric thin film material is included in a DRAM cell.

7. The BST high dielectric constant thin film material according to claim 1, wherein said BST high dielectric thin film material is formed in a capacitor.

8. An integrated circuit capacitor device formed by the steps of:
    forming a first electrode over a substrate;
    forming a thin film dielectric layer of a high capacitance material over said first electrode, wherein said thin film layer is a pervoskite of the formula ABO$_3$ where A represents metals selected from Ba, Bi, Sr, Pb, Ca, and La, and B represents metals selected from Ti, Zr, Ta, Mo, W, and Nb;
    implanting said thin film layer with dopants by ion implantation, said implanting including doping the A-site of said thin film layer with an ion; and
    forming a second electrode on said doped thin film layer to complete said integrated circuit capacitor.

9. The integrated circuit capacitor device according to claim 8, wherein said thin film layer is selected from the group consisting of BST, SBT, SrTiO$_3$ and PZT.

10. The integrated circuit capacitor device according to claim 9, wherein said thin film layer is BST.

11. The integrated circuit capacitor device according to claim 10, wherein the ratio of Ba to Sr is about 70:30.

12. The integrated circuit capacitor device according to claim 9, wherein said integrated circuit capacitor is a container capacitor.

13. The integrated circuit capacitor according to claim 12, further comprising varying the implant angle of said ion implantation step to evenly dope said high capacitance thin film layer.

14. The integrated circuit capacitor according to claim 9, wherein said integrated circuit capacitor is formed over a stud.

15. The integrated circuit capacitor according to claim 14, further comprising varying the implant angle of said ion implantation step to evenly dope said high capacitance thin film layer.

16. The integrated circuit capacitor device according to claim 8, wherein said dopants are selected from the group consisting of niobium, lanthanum, antimony and tantalum.

17. The integrated circuit capacitor device according to claim 8 wherein said ion is a lanthanum$^{3+}$ ion.

18. The integrated circuit capacitor device according to claim 8, wherein said pervoskite is barium strontium titanite.

19. The integrated circuit capacitor device according to claim 8, wherein said pervoskite is barium strontium titanite and said doping includes doping the B-site with a dopant selected from the group consisting of Nb$^{5+}$, Sb$^{5+}$ and Ta$^{5+}$.

20. The integrated circuit capacitor device according to claim 8, wherein said first and second electrodes are selected from the group consisting of Pt, Ru, Ir, Pd, Au RuOx, and IrOx.

21. The integrated circuit capacitor device according to claim 8, wherein said integrated circuit capacitor is a container capacitor.

22. The integrated circuit capacitor according to claim 21, further comprising varying the implant angle of said ion implantation step to evenly dope said high capacitance thin film layer.

23. The integrated circuit capacitor according to claim 8, wherein said integrated circuit capacitor is formed over a stud.

24. The integrated circuit capacitor according to claim 23, further comprising varying the implant angle of said ion implantation step to evenly dope said high capacitance thin film layer.

25. The integrated circuit capacitor according to claim 8, wherein said integrated circuit capacitor is fabricated in a DRAM cell.

* * * * *